(12) United States Patent
Dunham

(10) Patent No.: US 6,206,972 B1
(45) Date of Patent: Mar. 27, 2001

(54) METHOD AND APPARATUS FOR PROVIDING UNIFORM GAS DELIVERY TO SUBSTRATES IN CVD AND PECVD PROCESSES

(75) Inventor: Scott William Dunham, Fremont, CA (US)

(73) Assignee: Genus, Inc., Sunnyvale, CA (US)

(*) Notice: Subject to any disclaimer, the term of this patent is extended or adjusted under 35 U.S.C. 154(b) by 0 days.

(21) Appl. No.: 09/350,417

(22) Filed: Jul. 8, 1999

(51) Int. Cl.$^7$ .............................. C23C 16/00; B05B 1/24
(52) U.S. Cl. ................... 118/715; 239/132.3; 239/132; 239/424
(58) Field of Search .................. 118/715; 204/298.07; 239/132.3, 424, 128, 132

(56) References Cited

U.S. PATENT DOCUMENTS

| | | | |
|---|---|---|---|
| 5,728,223 | * | 3/1998 | Murakami et al. ............ 118/715 |
| 5,950,925 | * | 9/1999 | Fukunaga et al. ............ 239/132.3 |
| 5,972,114 | * | 10/1999 | Yonenaga et al. ............ 118/715 |
| 5,997,649 | * | 12/1999 | Hillman ........................ 118/715 |
| 6,123,775 | * | 9/2000 | Hao et al. ..................... 118/724 |
| 6,126,753 | * | 10/2000 | Shinriki et al. ............... 118/715 |

* cited by examiner

Primary Examiner—Jeffrie R. Lund
(74) Attorney, Agent, or Firm—Donald R. Boys; Central Coast Patent Agency

(57) ABSTRACT

A showerhead diffuser apparatus for a CVD process has a first channel region having first plural independent radially-concentric channels and individual gas supply ports from a first side of the apparatus to individual ones of the first channels, a second channel region having second plural independent radially-concentric channels and a pattern of diffusion passages from the second channels to a second side of the apparatus, and a transition region between the first channel region and the second channel region having at least one transition gas passage for communicating gas from each first channel in the first region to a corresponding second channel in the second region. The showerhead apparatus has a vacuum seal interface for mounting the showerhead apparatus to a CVD reactor chamber such that the first side and supply ports face away from the reactor chamber and the second side and the patterns of diffusion passages from the second channels open into the reactor chamber. In preferred embodiments the supply ports, transition passages, and diffusion passages into the chamber do not align, and there is a special plasma-quenching ring in each of the second channels preventing plasma ignition within the channels in the showerhead. Methods and systems using the showerhead are also taught.

14 Claims, 5 Drawing Sheets

Section AA

METHOD AND APPARATUS FOR PROVIDING UNIFORM GAS DELIVERY TO SUBSTRATES IN CVD AND PECVD PROCESSES

FIELD OF THE INVENTION

The present invention is in the field of Chemical Vapor Deposition (CVD), including Plasma Enhanced Chemical Vapor Deposition (PECVD) and related processes, and pertains more particularly to methods and apparatus for controlling flux uniformity for gas delivery.

BACKGROUND OF THE INVENTION

In the field of Thin Film Technology, used extensively in manufacture of integrated circuits, requirements for thinner deposition layers, better uniformity over larger surfaces, and larger production yields have been, and are, driving forces behind emerging technologies developed by equipment manufactures. As semiconductor devices become smaller and faster, the need for greater uniformity and process control in layer thickness, uniformity, resistivity and other film properties rises dramatically.

Various technologies are well known in the art for applying thin films to substrates in manufacturing steps for integrated circuits (ICs). Among the more established technologies available for applying thin films is Chemical Vapor Deposition (CVD), which includes Plasma Enhanced Chemical Vapor Deposition (PECVD). These are flux-dependent applications requiring specific and uniform substrate temperature and precursors (chemical species) to be in a state of uniformity in the process chamber in order to produce a desired film properties on a substrate surface. These requirements become more critical as substrate size increases, and as device size decreases (i.e. line width) creating a need for more complexity in chamber design and gas flow techniques to maintain adequate uniformity.

CVD systems use a variety of known apparatus for delivering precursor gases to target substrates. Generally speaking, gas delivery schemes for CVD and PECVD processes are designed specifically for one particular application and substrate size. Therefore variations in theme of such delivery apparatus and methods will depend on the particular process parameters and size of substrates being processed in a single reactor. Prior art gas manifolds and diffusers have been manufactured from a variety of materials and are widely varied in design. For example, some gas delivery manifolds are long tubes that are either straight or helical with a plurality of small, often differently sized, gas delivery holes spaced longitudinally along the manifold. Most diffusers and showerheads are basically baffle-type structures having a plurality of holes placed in circular or spiral type arrangements on opposite facing plates or surfaces. Often the holes are contained in a series of expanding radii circles on each plate. Often such apparatus is adapted only for one type of process and cannot be used with other processes using the same CVD equipment.

One characteristic that is generally required in CVD gas delivery apparatus is that hole sizes and spacing between the holes is strictly controlled such that a uniform gas distribution or zone is maintained over a particular surface area. Uneven gas flow often results if some holes are inadvertently made too large in comparison with a mean size, or placed in wrong positions. If a larger substrate is used in a same or different chamber, then the gas delivery apparatus must often be exchanged for one that is designed and adapted for the variance in substrate size and/or chamber parameters. Improvements made to manifold and diffuser designs depend largely on empirical methods in the field resulting in numerous cases of product expenditure through batch testing.

Uniform gas delivery remains a formidable challenge in the CVD processing of substrates. If gas delivery uniformity cannot be strictly controlled, layer thickness will not be uniform. The problem progresses with increased target size and as more layers are added. Moreover, many substrates to be coated already have a complex topology introducing a requirement for uniform step coverage. PECVD in many cases has advantages over CVD in step coverage by virtue of delivering more reactive chemical precursors, energized by the plasma. However, to this date, methods for gas delivery in CVD, including PECVD type systems, have much room for improvement.

One problem with many diffusing showerhead systems relates to limited gas flow dynamics and control capability. For example, gas delivered through a typical showerhead covers a diffusion zone inside the chamber that is produced by the array of diffusion holes placed in the showerhead. If a system is designed for processing a 200-mm wafer or wafer batch, the gas diffusion apparatus associated with that system will produce a zone that is optimum for that size. If the wafer size is increased or reduced beyond the fixed zone capability of a particular showerhead, then a new diffusion apparatus must be provided to accommodate the new size. There are typically no conventions for providing more than a few zones or for alternating precursor delivery for differing size substrates in one process.

In an environment wherein different sizes of substrates are commonly processed, it is desired that diffusing methods and apparatus be more flexible such that multi-zone diffusing on differing size substrates is practical using one showerhead system. This would allow for less downtime associated with swapping equipment for varying situations, and better uniformity by combining and alternating different zones during diffusion. Prior art diffusing methods and apparatus do not meet requirements for this type of flexibility.

Another problem in this technology is that various gases of different characteristics are mixed for a particular process. There are variations in density, temperature, reactivity and the like, such that perfect uniformity in gas mixture composition and density at delivery still does not produce precise uniformity in layer deposition. In some processes an intentional non-uniformity of gas delivery will be required to produce layer uniformity.

What is clearly needed is an enhanced precursor-delivery apparatus and method that allows for a strict and combined control of gas distribution over multiple target zones in a reactor, and has several degrees of freedom in gas mixing, delivery, and uniformity control. Such a system would provide a capability for adjusting gas flow in a manner that point-of-process reaction uniformity may be achieved, providing superior film property uniformity. Such a system may be adapted to function in a wide variety of CVD and PECVD applications.

SUMMARY OF THE INVENTION

In a preferred embodiment of the present invention a showerhead diffuser apparatus for a CVD process is provided, comprising a first channel region having first plural independent radially-concentric channels and individual gas supply ports from a first side of the apparatus to individual ones of the first channels; a second channel region having second plural independent radially-concentric channels and a pattern of diffusion passages from the second channels to a second side of the apparatus; a transition region between the first channel region and the second channel region having at least one transition gas passage for communicating gas from each first channel in the first region to a corresponding second channel in the second region; and a vacuum seal interface for mounting the showerhead apparatus to a CVD reactor chamber such that the first side and supply ports face away from the reactor chamber and the second side and the patterns of diffusion passages from the second channels open into the reactor chamber.

In preferred embodiments the second side comprises a flat surface such that the diffusion passages from the second channels open into the reactor chamber on a plane. Also in preferred embodiments the vacuum seal interface comprises a flange having bolt holes and an o-ring for mounting to and sealing to a wall of the reactor chamber.

To enhance gas diffusion and mixing in embodiments of the invention the supply ports into the first channels and the transition passages from the first channels into second channels are offset in position such that no supply port is aligned with a transition passage. In preferred embodiments there are also coolant passages in the second channel region facing the inside of a reactor chamber, for protecting the showerhead apparatus from heat from within the chamber, and for impeding process film deposition on the showerhead face.

In another aspect of the invention a CVD reactor system is provided, comprising a reactor chamber having an opening for a showerhead apparatus; a support in the chamber adjacent the opening, the support for a substrate to be processed; and a showerhead diffuser apparatus for a CVD process, the showerhead having a first channel region having first plural independent radially-concentric channels and individual gas supply ports from a first side of the apparatus to individual ones of the first channels, a second channel region having second plural independent radially-concentric channels and a pattern of diffusion passages from the second channels to a second side of the apparatus, a transition region between the first channel region and the second channel region having at least one transition gas passage for communicating gas from each first channel in the first region to a corresponding second channel in the second region, and a vacuum seal interface for mounting the showerhead apparatus to a CVD reactor chamber such that the first side and supply ports face away from the reactor chamber and the second side and the patterns of diffusion passages from the second channels open into the reactor chamber. In the reactor system the second side comprises a flat surface such that the diffusion passages from the second channels open into the reactor chamber on a plane.

In another aspect of the invention a method for distributing gases to a wafer in a CVD coating process is provided, comprising steps of (a) introducing gases for the process via individual supply ports into individual ones of plural radially-concentric first channels of a first channel region of a showerhead apparatus; (b) flowing the gases from the first channels via transition passages into corresponding radially-concentric second channels in a second channel region; and (c) diffusing the gases from the second channels through diffusion passages opening through a flat surface of the showerhead apparatus parallel to and adjacent the wafer to be coated.

In yet another aspect of the invention a method for adjusting gas flux distribution over a wafer in a CVD coating operation is provided, comprising steps of (a) introducing gases for the coating operation via individual supply ports into individual ones of plural radially-concentric first channels of a first channel region of a showerhead apparatus; (b) flowing the gases from the first channels via transition passages into corresponding radially-concentric second channels in a second channel region; (c) diffusing the gases from the second channels through diffusion passages opening through a flat surface of the showerhead apparatus parallel to and adjacent the wafer to be coated; and (d) adjusting the gas flux distribution over the wafer by individually metering mass flow to individual ones of the individual supply ports to the first channels.

In the embodiments of the invention for the first time a diffuser is provided with flexibility to adjust gas distribution flux in a number of different ways, allowing a diffuser to be dialed-in to account for many gas parameters such as reactivity and the like. Various embodiments of the invention are taught in enabling detail below.

BRIEF DESCRIPTION OF THE DRAWING FIGURES

DESCRIPTION OF THE PREFERRED EMBODIMENTS

As described in the background section, obtaining consistent and uniform material layering in semiconductor manufacturing is paramount to producing high quality semiconductor devices. However, there are many limitations inherent to prior-art diffusing apparatus that continue to plague manufacturers using CVD or CVD-variant applications. The inventor provides in this disclosure a unique apparatus and method for enhancing process uniformity by utilizing multi-zone capabilities and strictly controlled gas delivery methods. The method and apparatus of the present invention is described in enabling detail below.

Figure 1:
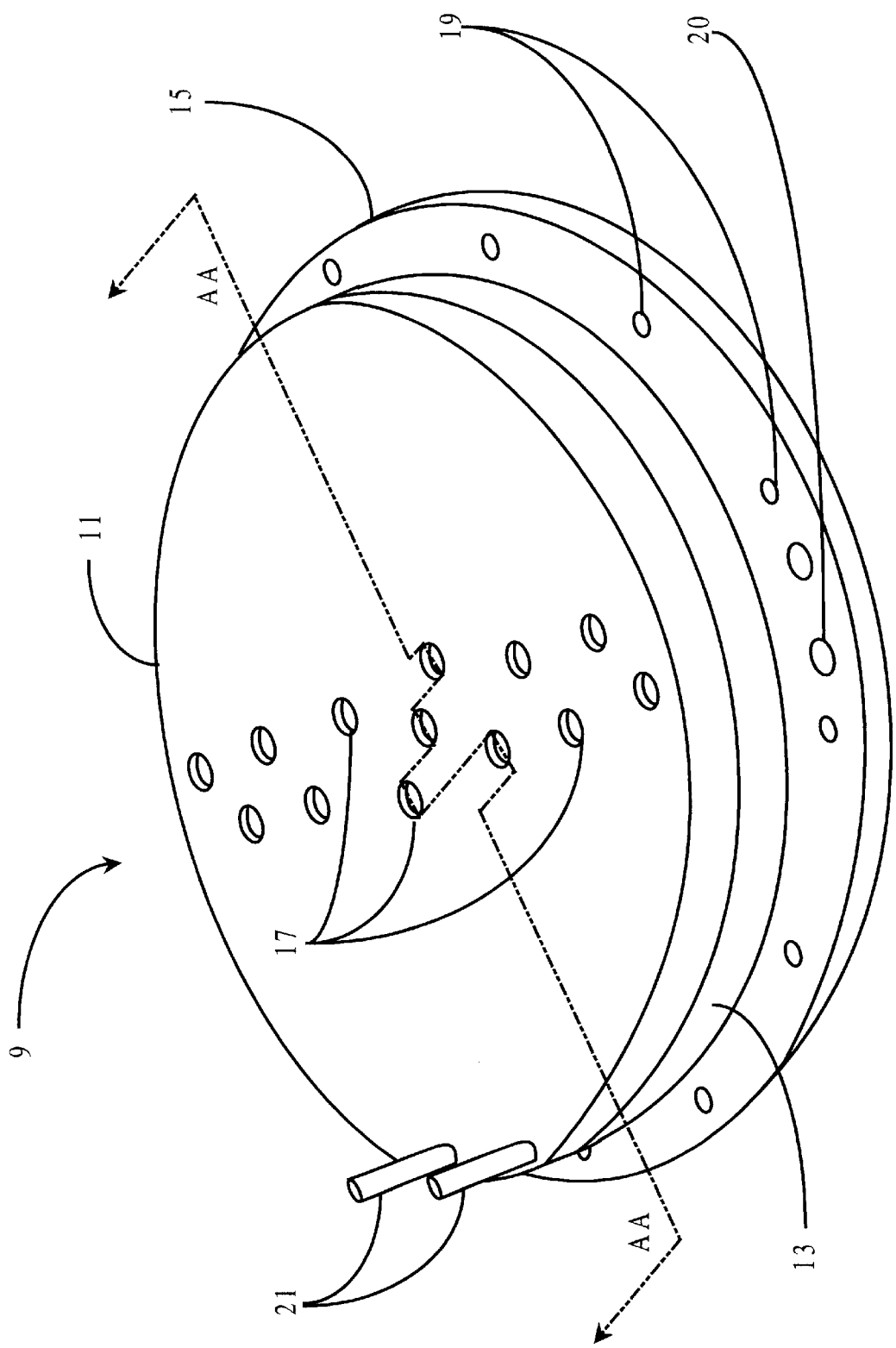
FIG. 1 is an isometric view of a multi-zone diffuser according to an embodiment of the present invention.

FIG. 1 is an isometric view of a multi-zone diffuser 9 according to an embodiment of the present invention. Diffuser 9 is adapted for delivering gas precursors and inert gases for the purpose of depositing films in CVD or CVD-variant processes.

Diffuser 9 is an assembly comprising in this embodiment three basic components, being an upper diffusion channel assembly 11, a gas transition baffle-plate 13, and a lower diffusion channel assembly 15. Components 11, 13, and 15 are, in a preferred embodiment, rigidly integrated into a whole by brazing or other joining method.

Diffuser 9 is designed and adapted to be fitted by a flange and suitable sealing elements to a process reactor (not shown) for the purpose of dispensing process gasses over a suitable substrate within. In one preferred embodiment Diffuser 9 engages through a lid of a single-wafer processing system. A lower portion (not visible in this view) of channel assembly 15 extends into a reactor when diffuser 9 is properly mounted. A plurality of through holes 19 on the flange portion of lower coil-assembly 15 are for bolts used in mounting to a lid of a reactor chamber, and holes 20 are provided for mounting an RF electrode in an alternative embodiment within a reactor for striking and maintaining plasma if required for any purpose, such as (PECVD).

Diffuser 9, by virtue of the above-described components, allows metered supply of gases to CVD or CVD-variant processes according to pre-calculated parameters. The features of diffuser 9 are designed to produce multiple radial gas-zones over a target in order to achieve an enhanced uniformity controllability in layer deposition that has not previously been achieved with prior-art systems. Diffuser 9 further provides an ability to supply a wide variety of gases in metered fashion to some or all of the defined gas zones either alternately or in combination. This unique capability allows manufacturers to easily fine-tune layer uniformity in process to achieve optimum and repeatable layer uniformity over simple and complex topologies.

Upper coil-assembly 9 has a plurality of gas-supply passages 17 passing through an upper plate-surface. Each supply passage 17 feeds to one of multiple gas zones defined by a plurality of radial channels provided within assembly 11, shown in further Figs. and descriptions below. Gas supply tubes and fittings adapted to conduct gases to passages 17 are not shown here for simplicity. Coolant delivery tubes 21 (an inlet and an outlet) are provided on the upper surface of coil-assembly 11 and are adapted to allow coolant to circulate through coolant channels in diffuser 9. More detail about diffuser 9 and internal components is provided below.

Figure 2:
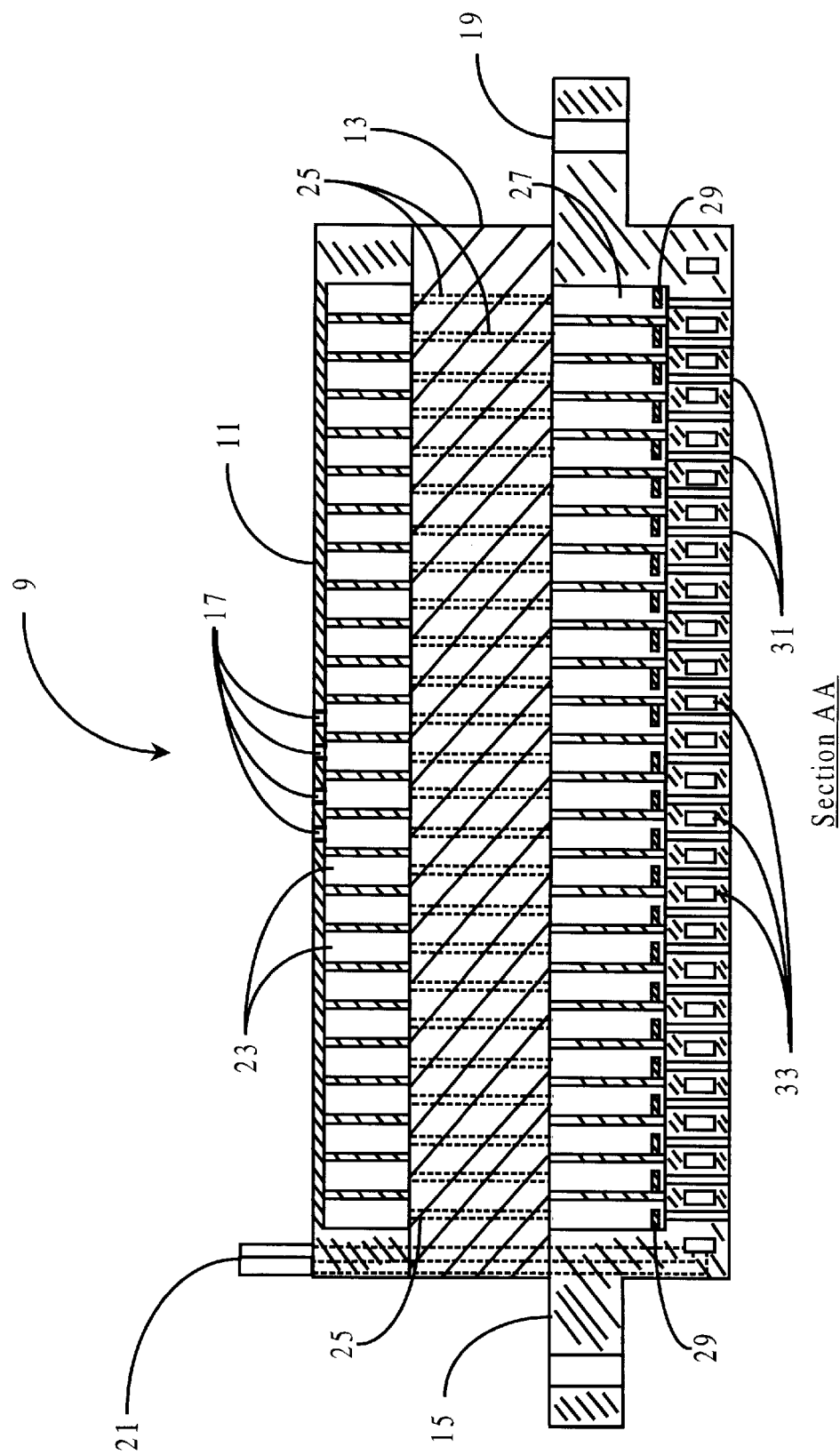
FIG. 2 is a section view of the multi-zone diffuser of FIG. 1 taken along the section line A—A.

FIG. 2 is a section view of diffuser 9 of FIG. 1 taken along the section line AA. Upper channel assembly 11 has a plurality of radial gas zones that are of differing diameters and are positioned in spaced concentric fashion. In this example, there are a total of thirteen zones 23, however there may be more or fewer zones 23 without departing from the spirit and scope of the present invention.

Each zone 23 is an independent circular channel, and is supplied by one gas supply passage 17, four of which are shown in this section view. By this arrangement different gases may be supplied to different gas zones 23 independently with no gas mixing or crosstalk from one zone to another. Moreover, because there is no crosstalk between individual zones 23, differing flow pressures may be applied to each specific zone. For example, a low metered flow may be provided to a channel closer to the center of the diffuser while a higher metered flow may be applied to a zone closer to the outer periphery. In addition, zones 23 may be used in alternate fashion. For example, by selectively shutting off gas supply to any one or a combination of gas supply passages 17, associated zones 23 may be shut off without affecting gas flow to other zones. This allows process operators much more flexibility when introducing separate gases into a process.

Lower channel assembly 15 has concentric channels in the same radial geometry as upper channel assembly 11, and baffle plate 13, which forms a center portion of diffuser 9, has a plurality of elongated gas transition passages 25 strategically placed therethrough, feeding gas from each upper channel to a corresponding lower channel. Baffle plate 13 is preferably manufactured of one solid metal piece. There may be any number and spacing of transition passages 25 through baffle element 13 for each pair of upper and lower channels without departing from the spirit and scope of the present invention. For example, an outer channel pair may have many more transition passages than in inner channel pair.

Transition passages 25 are significantly elongated by virtue of the thickness of plate 13 and substantially smaller in diameter than supply passages 17. Transition passages 25 may, as in this example, all be of the same diameter, or may be of differing diameters such as may be determined to effect specific desired gas flow characteristics. In addition to the length and diameter of transition passages 25, zone specific orientation of and number of holes 25 per zone may vary according to calculated determinates, which may be obtained through computer modeling, and are intended to produce optimum uniformity characteristics. These calculated determinates also determine the thickness of baffle assembly 13, thus defining the length of passages 25.

Channels 27 in assembly 15 are in this embodiment somewhat deeper (height) than channels 23 of assembly 11. This feature aids in further diffusing of gasses before they are passed into a reactor. A plurality of gas diffusion passages 31 are provided through a lower portion of channel assembly 15 into a reactor. Passages 31 are for allowing gases to pass from channels 27 into the reactor. The gases passing through passages 31 into the reactor are optimally distributed according to pre-determined parameters. The number of gas diffusion passages 31 per channel is typically substantially greater in embodiments of the invention than the number of gas transition passages 25 per channel. For example, an outer-most channel 27 may have three transition passages 25 (inlet to channel) and, perhaps 30 diffusion passages 31 (outlet from channel).

In embodiments of the invention an RF barrier ring 29 is provided one for each channel 27. RF rings 29 are designed and adapted to baffle the passages from channels 27 into the reactor chamber in a manner that a plasma struck in the chamber will not migrate into channels 27 of diffuser 9. RF rings 29 are made of a suitable electrically-conductive metal, and each RF ring 29 is preferably welded in each channel 27 just above the bottom surface of the channel, leaving space on the sides as shown, so gases passing from each channel 27 into a passage 31 must traverse a convoluted path of dimensions small enough to quench any plasma. In practice rings 29 are formed with three or more dimples facing downward at positions not aligned with passages 31, the rings are positioned with the bottom surface of these dimples touching a surface slightly above the bottom of the respective channels, and the rings are then spot welded in the bottom of the channels to that mounting surface.

Water passages 33 are provided in the walls separating channels 27 in channel assembly 19 allowing water cooling, as substrates to be processed are typically heated to a high temperature on a hearth in the chamber. Tubes 21 provide an inlet and outlet for coolant as previously described.

It will be apparent to one with skill in the art that diffuser 9 may be manufactured in many different diameters having different numbers of gas zones and channels without departing from the spirit and scope of the present invention. In preferred embodiments, diffuser 9 is manufactured to accommodate a specific semiconductor wafer size, such as a 200 mm or 300 mm wafer. In practical application a diffuser made for one wafer size may be used for wafers of a smaller size by closing gas supply to outer channels and tuning gas supply to remaining channels.

It will also be apparent to one with skill in the art that a diffuser according to embodiments of the present invention may be manufactured according to dimensional determinates derived from computer modeling of gas flow dynamics. In this way, extensive field testing of uniformity characteristics normally required in prior-art process applications can be avoided. However, fine-tuning uniformity characteristics such as by adjusting flow rates to specific gas zones, shutting down certain gas zones, and the like may be practiced during process by operators using diffuser 9.

Figure 3:
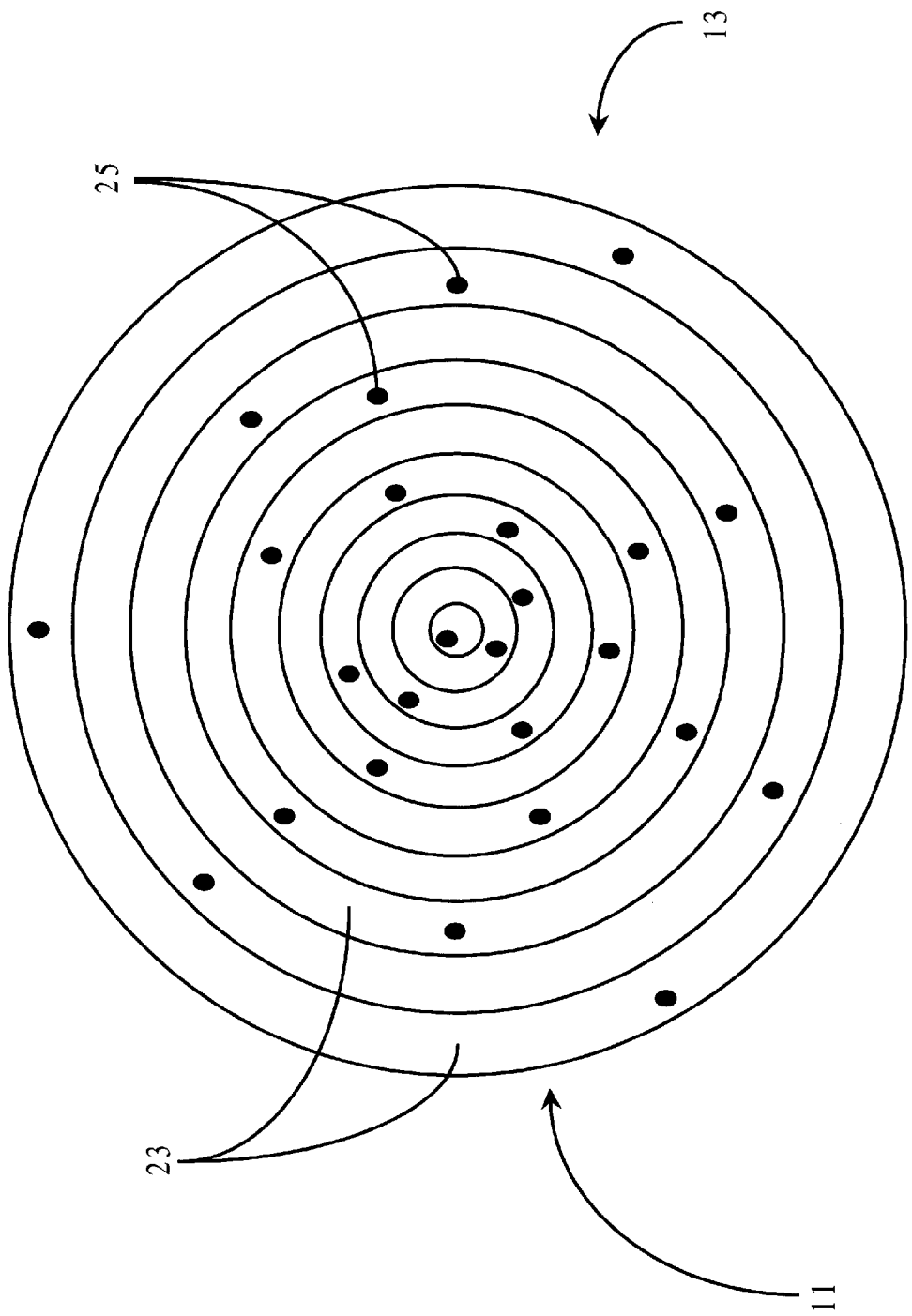
FIG. 3 is a diagram illustrating upper gas zones and gas transition passage locations according to an embodiment of the present invention.

FIG. 3 is a diagram illustrating arrangement of upper gas channels 23 and exemplary locations of gas transition passages 25 according to an embodiment of the present invention. Channels 23 are in a concentric arrangement in relation to one another as previously described. Each channel 23 communicates with specific gas transition passages 25, which are machined through baffle-plate 13. For example, the centermost channel 23 has one gas transition passage 25. A third channel 23 (counting out from center) has two gas transition passages 25. Progressing toward the periphery, each successive channel thereafter has three gas transition passages 25. This specific arrangement in terms of number of passages 25 for each channel 23 is not to be construed as a limitation, but simply that centermost gas channels will typically require less gas flow than outer channels.

Transition passages 25 are, in this embodiment, arranged in an equally-spaces formation (120-degree placement) with respect to each channel 23 having three passages per channel. Each formation of transition passages 25 has an offset orientation from passage locations in adjacent channels. This helps to facilitate even gas dispersal from upper channels 23 to lower channels 27, however, it is not required to practice the present invention. Computer modeling in different embodiments provides optimum data for quantity and positioning of transition passages 25 to facilitate optimum gas flow dynamics.

Diffuser 9 provides at least four degrees of freedom for facilitating graduated transition of gases from outer to inner gas channels. One option is regulating passage dimensions for transition passages 25 and by providing a constant number of passages 25 for each channel 23, with the passages for the channels closer to center having smaller passages and increasing the passage size (diameter) for passages in channels from channel to channel toward the outer diameter of the diffuser. Another option is to provide a constant number of transition passages per channel, but to regulate channel capacity by providing wider channels toward the center and narrower channels toward the outer diameter of the diffuser. Limiting the number of transition passages toward the center, as is shown here, is yet another option. Still another option is simply metering gas flow rates to each independent channel by virtue of channel-independent supply lines.

Figure 4:
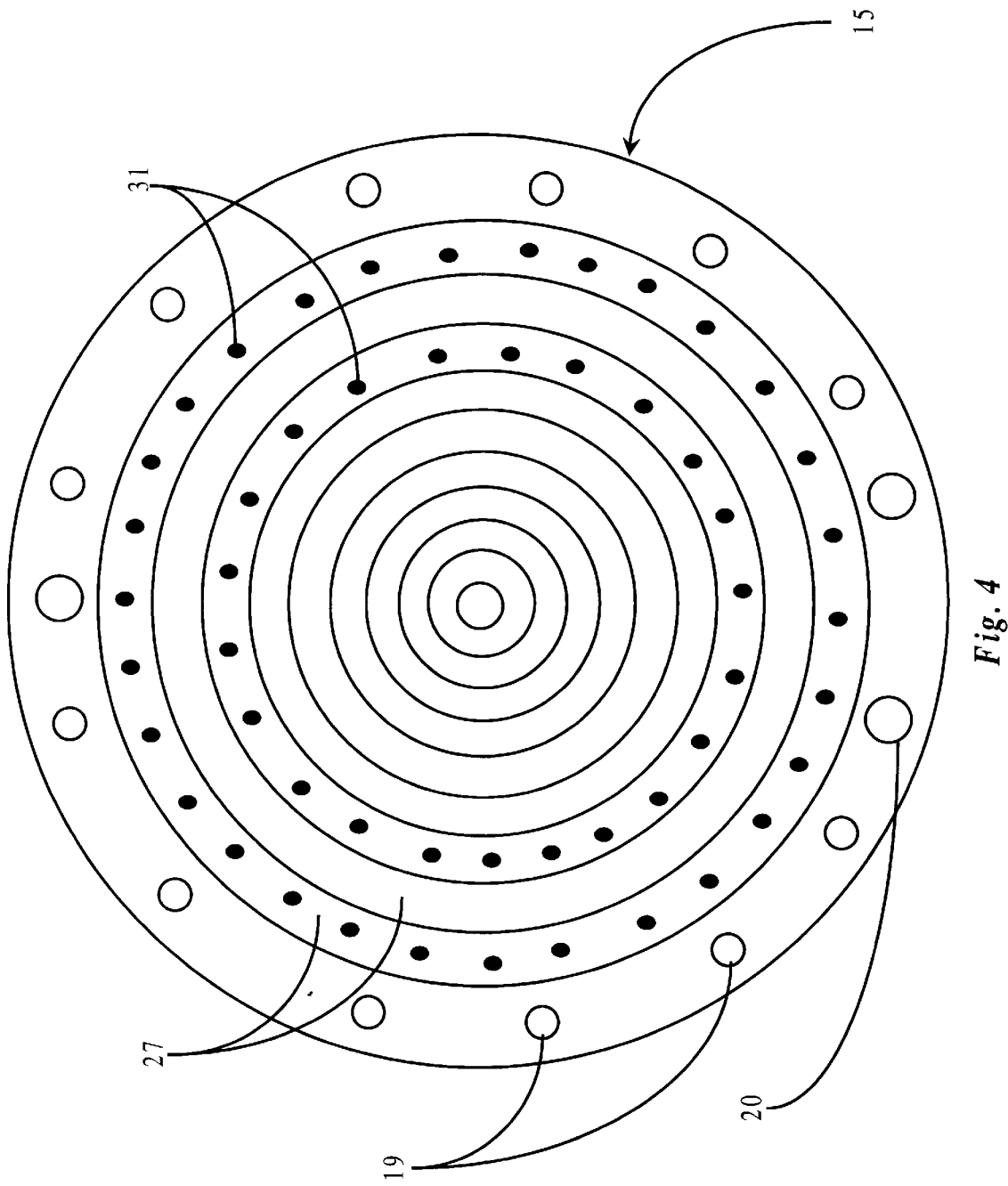
FIG. 4 is a diagram illustrating lower gas zones and gas diffusion passages according to an embodiment of the present invention.

FIG. 4 is a diagram illustrating placement of gas diffusion passages in lower channel-assembly 15 according to an embodiment of the present invention. Each channel 27 has a plurality of equally-spaced diffusion passages arranged in a circular pattern. Only two channels 27 are illustrated herein with diffusion passages 31 to avoid confusion, however, all zones may be assumed to have diffusion passages 31.

A marked difference between the arrangement of transition passages 25 as shown in FIG. 3 and diffusion passages 31 is that there are far more diffusion passages 31 than transition passages 25. In this embodiment, passages 31 are placed one about every 12 degrees or 30 holes 31 per channel 27.

The hole spacing is not necessarily based on azimuthal location in all embodiments. In one embodiment the holes are based on maintaining a 0.375 distance between any hole and all the holes around it, including the holes on the next higher and/or lower radius. Current design has 69 holes on the outer most zone. The 30 mm based design has 125 on its outer most zone. Zone spacing is based on maintaining the same 0.375 distance. However the number of diffusion passages may be more or fewer, and the number per channel may vary as well.

The same flexibility regarding passage dimensions, channel width, channel combination or alternate use, quantity of passages, and so on is attributed to lower channel assembly 15 as was described above regarding baffle plate 13 and upper channel assembly 11. Gas flow through diffusion passages 33 in any one channel 27 may be adjusted by metering gas to independent gas supply lines entering diffuser 9. In most embodiments, diffusion passages 33 will be smaller than transfusion passages 25 and supply passages 17. Each stage increases gas diffusion without turbulence thus obtaining better gas distribution and uniform flow.

Figure 5:
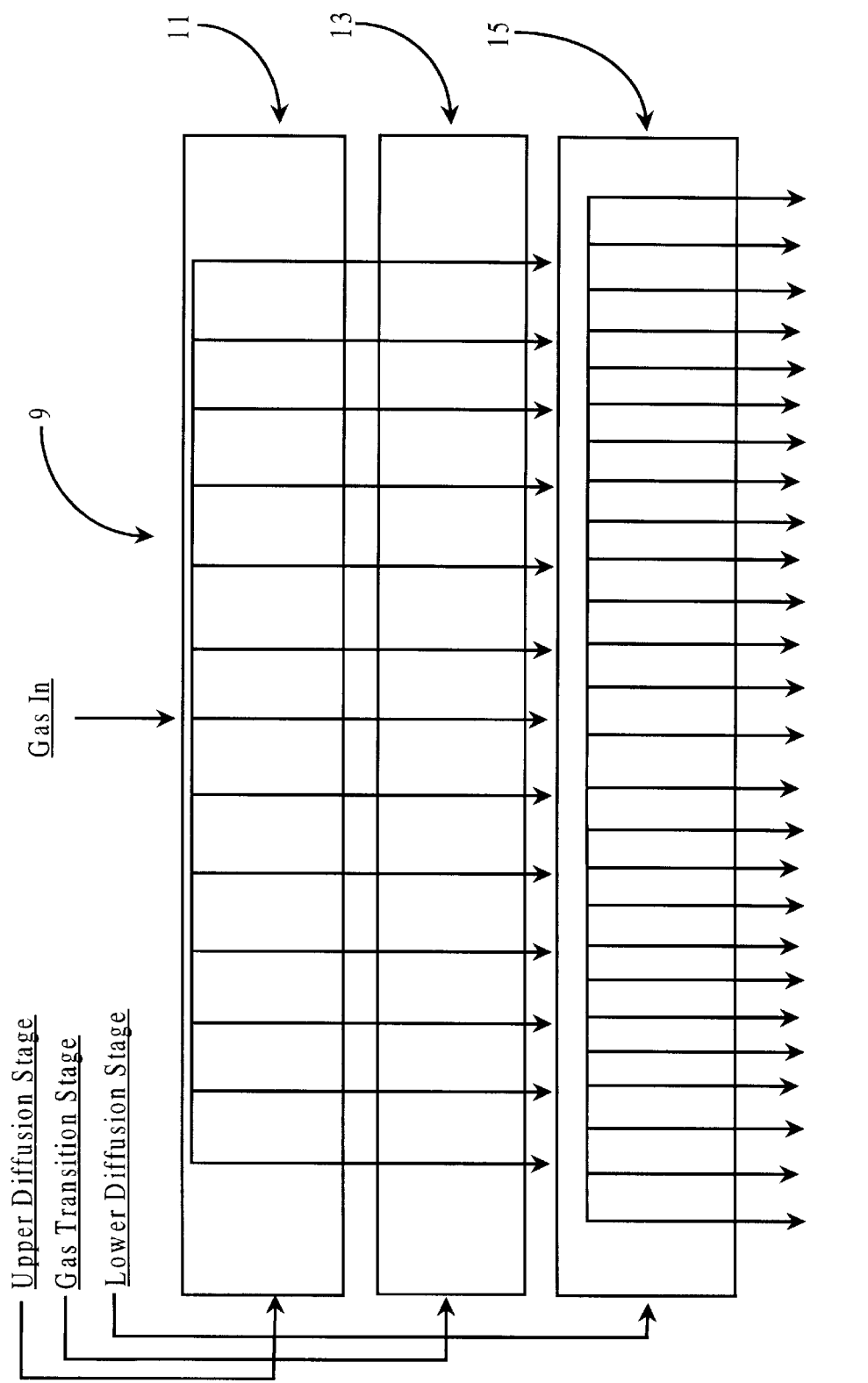
FIG. 5 is a block diagram illustrating three gas separation stages in the apparatus of FIG. 1 according to an embodiment of the present invention.

FIG. 5 is a diagram illustrating the three gas separation stages utilized by diffuser 9 according to an embodiment of the present invention. Diffuser 9, as previously described, has an upper diffusion stage provided by upper channel assembly 11. Gas is supplied to upper channel assembly 11 through zone-independent gas-supply lines 17, represented here by an arrow labeled Gas In. In the upper diffusion stage, gas is introduced and diffuses in channels 23 (FIG. 3) before passing through baffle-plate 13.

A gas transition stage is performed by baffle-plate 13 with transition passages 25. Gas in channels 23 is further diffused and directed as it passes through plate 13. A lower diffusion stage is performed in channel assembly 15. In the final stage the gases are further diffused as they pass through lower channel assembly 15. In a chamber, the introduced gases conform to multiple radial gas zones created therein by virtue of diffusion hole placement and positioning. Also by virtue of the long and convoluted passages of gases into the reactor chamber, the gases finally enter the chamber without any sudden expansion or turbulence. In this way, a substrate 35 may be uniformly interfaced to the gas flux facilitating uniform layer formation. Fine-tuning may be performed to further enhance uniformity by adjusting gas flow to separate channels, using some channels but not others, and so on.

It will be apparent to one with skill in the art that the method and apparatus of the present invention provides a unique enhancement and control for process operators not provided by prior art diffusing apparatus used in CVD processes. The provision of multiple but separate gas delivery channels over a target is a significant enhancement over the prior art.

It will further be apparent to a skilled artisan that because computer modeling of gas flow dynamics is performed to determine optimum parameters for dimensions of elements of diffuser 9, such parameters may be varied for different types of processes. Such parameters may also change due to different determinates derived from improved modeling techniques. Therefore, the method and apparatus of the present invention should be afforded the broadest scope. The spirit and scope of the present invention is limited only by the claims that follow.

What is claimed is:

1. A showerhead diffuser apparatus for a CVD process, comprising:

a first channel region having first plural independent radially-concentric channels and individual gas supply ports from a first side of the apparatus to individual ones of the first channels;

a second channel region having second plural independent radially-concentric channels and a pattern of diffusion passages from the second channels to a second side of the apparatus;

a transition region between the first channel region and the second channel region having at least one transition gas passage for communicating gas from each first channel in the first region to a corresponding second channel in the second region; and a vacuum seal interface for mounting the showerhead apparatus to a CVD reactor chamber such that the first side and supply ports face away from the reactor chamber and the second side and the patterns of diffusion passages from the second channels open into the reactor chamber.

2. The showerhead apparatus of claim 1 wherein the second side comprises a flat surface such that the diffusion passages from the second channels open into the reactor chamber on a plane.

3. The showerhead apparatus of claim 1 wherein the vacuum seal interface comprises a flange having bolt holes and an o-ring for mounting to and sealing to a wall of the reactor chamber.

4. The showerhead apparatus of claim 1 wherein the supply ports into the first channels and the transition passages from the first channels into second channels are offset in position such that no supply port is aligned with a transition passage.

5. The showerhead apparatus of claim 1 wherein the transition passages into the second channels are offset from the diffusion passages into the reactor chamber such that no transition passage is aligned with a diffusion passage.

6. The showerhead apparatus of claim 1 further comprising coolant channels in walls separating second channels in the second channel region, the coolant channels interconnected such that a single inlet port and a single outlet port provides coolant through all of the coolant channels.

7. The showerhead apparatus of claim 6 comprising an inlet and an outlet supply tube extending from the first side connecting to the inlet and the outlet ports.

8. A CVD reactor system, comprising:

a reactor chamber having an opening for a showerhead apparatus;

a support in the chamber adjacent the opening, the support for a substrate to be processed; and a showerhead diffuser apparatus for a CVD process, the showerhead having a first channel region having first plural independent radially-concentric channels and individual gas supply ports from a first side of the apparatus to individual ones of the first channels, a second channel region having second plural independent radially-concentric channels and a pattern of diffusion passages from the second channels to a second side of the apparatus, a transition region between the first channel region and the second channel region having at least one transition gas passage for communicating gas from each first channel in the first region to a corresponding second channel in the second region, and a vacuum seal interface for mounting the showerhead apparatus to a CVD reactor chamber such that the first side and supply ports face away from the reactor chamber and the second side and the patterns of diffusion passages from the second channels open into the reactor chamber.

9. The CVD reactor system of claim 8 wherein the second side comprises a flat surface such that the diffusion passages from the second channels open into the reactor chamber on a plane.

10. The CVD reactor system of claim 8 wherein the vacuum seal interface comprises a flange having bolt holes and an o-ring for mounting to and sealing to a wall of the reactor chamber.

11. The CVD reactor system of claim 8 wherein the supply ports into the first channels and the transition passages from the first channels into second channels are offset in position such that no supply port is aligned with a transition passage.

12. The CVD reactor system of claim 8 wherein the transition passages into the second channels are offset from the diffusion passages into the reactor chamber such that no transition passage is aligned with a diffusion passage.

13. The CVD reactor system of claim 8 further comprising coolant channels in walls separating second channels in the second channel region, the coolant channels interconnected such that a single inlet port and a single outlet port provides coolant through al of the coolant channels.

14. CVD reactor system of claim 13 comprising an inlet and an outlet supply tube extending from the first side connecting to the inlet ad the outlet ports.

* * * * *

UNITED STATES PATENT AND TRADEMARK OFFICE
CERTIFICATE OF CORRECTION

PATENT NO. : 6,206,972 B1
DATED : March 27, 2001
INVENTOR(S) : Scott William Dunham It is certified that error appears in the above-identified patent and that said Letters Patent is hereby corrected as shown below:

Title,
Reads "Method and Apparatus for Providing Uniform Tas Delivery to Substrates in CVD and PECVD Processes" should read -- "Method and Apparatus for Providing Uniform Gas Delivery to Substrates in CVD and PECVD Processes --

Signed and Sealed this

Sixth Day of November, 2001

Attest:

*Nicholas P. Godici*

NICHOLAS P. GODICI
*Attesting Officer*  *Acting Director of the United States Patent and Trademark Office*